United States Patent
Tailliet

(10) Patent No.: US 6,898,538 B2
(45) Date of Patent: May 24, 2005

(54) METHOD AND SYSTEM FOR THE ADJUSTMENT OF AN INTERNAL TIMING SIGNAL OR A CORRESPONDING REFERENCE IN AN INTEGRATED CIRCUIT, AND CORRESPONDING INTEGRATED CIRCUIT

(75) Inventor: François Tailliet, Le Tholonet (FR)

(73) Assignee: STMicroelectronics SA, Montrouge (FR)

(*) Notice: Subject to any disclaimer, the term of this patent is extended or adjusted under 35 U.S.C. 154(b) by 566 days.

(21) Appl. No.: 10/025,372

(22) Filed: Dec. 19, 2001

(65) Prior Publication Data

US 2002/0082791 A1 Jun. 27, 2002

(30) Foreign Application Priority Data

Dec. 20, 2000 (FR) .............................................. 00 16703

(51) Int. Cl.[7] .............................................. G11C 16/32
(52) U.S. Cl. .......................... 702/79; 365/201; 377/16; 702/106; 702/125
(58) Field of Search ............................ 702/79, 85, 106, 702/125; 377/16; 365/201; G11C 16/32

(56) References Cited

U.S. PATENT DOCUMENTS

| | | | |
|---|---|---|---|
| 4,128,892 A | * 12/1978 | Vasa | 702/79 |
| 4,348,743 A | * 9/1982 | Dozier | 702/79 |
| 4,564,918 A | * 1/1986 | McNally et al. | 702/79 |
| 4,849,973 A | * 7/1989 | Kubota | 365/201 |
| 5,262,716 A | * 11/1993 | Gregory et al. | 324/754 |
| 5,384,737 A | 1/1995 | Childs et al. | 365/189.05 |
| 5,903,512 A | 5/1999 | Wong et al. | 365/233 |
| 6,026,050 A | 2/2000 | Baker et al. | 365/233 |
| 6,115,836 A | * 9/2000 | Churchill et al. | 714/726 |

* cited by examiner

*Primary Examiner*—R. Stephen Dildine
(74) *Attorney, Agent, or Firm*—Lisa K. Jorgenson; Allen, Dyer, Doppelt, Milbrath & Gilchrist, P.A.

(57) ABSTRACT

A method for adjusting a duration of an internal timing signal in an integrated circuit with a value close to a typical value of the duration may include activating the internal timing signal in the integrated circuit and sequentially sending calibration values to an input of the integrated circuit. The expiration of the internal timing signal may determine the last calibration value received or being received, and the calibration data may be applied to a device for adjusting the duration of the internal timing signal.

36 Claims, 7 Drawing Sheets

METHOD AND SYSTEM FOR THE ADJUSTMENT OF AN INTERNAL TIMING SIGNAL OR A CORRESPONDING REFERENCE IN AN INTEGRATED CIRCUIT, AND CORRESPONDING INTEGRATED CIRCUIT

FIELD OF THE INVENTION

The invention relates to integrated circuits, and, more particularly, to a method for the adjustment of an internal timing signal, or of a corresponding reference, in an integrated circuit, and to an integrated circuit which implements the method. The invention may be applied to integrated circuits including reference circuits, e.g., voltage reference circuits, current reference circuits, and time duration reference circuits. One particular application relates to the testing of integrated circuits in parallel.

The invention may be particularly applicable to non-volatile memories for adjusting the duration of programming pulses applied to the memory cells. Other applications may include, for example, the calibration of a current or voltage source, or the calibration of an electronic potentiometer including a resistor network.

BACKGROUND OF THE INVENTION

In a non-volatile memory circuit (e.g., an electrically erasable programmable read-only memory (EEPROM) circuit), a control circuit produces a programming signal that typically includes two successive high-voltage pulses. These are for first causing an erasure operation and then a writing operation.

Such a programming signal PROGBIT-HV is illustrated in FIG. 1. The signal PROGBIT-HV has a calibrated total duration T0 and is provided by a high-voltage generation circuit activated by a programming command logic circuit PROGBIT. In the example, the programming signal PROGBIT is at logic 1 during the erasure/programming phase. By way of example, the typical value of the duration T0 may be 5 milliseconds with a tolerance window of 1 to 10 milliseconds.

The programming signal PROGBIT-HV has a high-voltage value HV and generally has to comply with well-specified constraints. These constraints on the characteristics (e.g., duration, high-voltage value) of the programmed signal are determined to ensure reliable programming. The duration of the programming signal should also enable sufficient charging of the memory cells. As for the maximum duration of the programming signal, it usually results from the functional specifications of the memory.

In practice, the characteristics of the programming signal vary from one integrated circuit to another due to the dispersion intrinsic to the technological manufacturing method implemented. The integrated circuits are typically tested when they come off the production line. These tests make it possible to discard those circuits whose characteristics do not come within the permissible range of values (according to the specifications of the integrated circuits).

SUMMARY OF THE INVENTION

The basic idea of the present invention is to provide devices in the integrated circuit to adjust these characteristics. These adjustment devices reduce the influence of the above noted dispersion resulting from the technological method used.

The duration T0 of the programming control signal PROGBIT is obtained from a circuit by which a reference current is used to charge and discharge a capacitor. The principle of the invention lies in making the tester measure the duration of the programming signal of the invention (FIG. 1) (erasure pulse+programming pulse) to deduce therefrom a calibration value with respect to the typical value T0. This calibration value is then applied to a corresponding adjustment device in the integrated circuit. For example, the adjustment device may be used to adjust the capacitance of the capacitor or the intensity of the reference current to obtain an adjusted programming duration close to the typical value T0.

In practice, what is required is measuring the real duration Tr of the programming signal in the integrated circuit under normal conditions of operation. Further, the calibration value $K_E$ is deduced therefrom, which is equal to the ratio of the typical value T0 to the real measured value Tr, i.e., $K_E=T0/Tr$. Additionally, this calibration value is applied in a device for the adjustment of the programming period so that an adjusted value Ta is obtained close to $K_E \cdot Tr$, namely close to the typical value T0 of the programming duration. The precision of the correction depends on the precision of the adjustment device used.

With a calibration method according to the invention, there is less divergence between the integrated circuits, and this stabilizes the working of the circuit. The programming time becomes very stable and the performance characteristics of the integrated circuits become closer to one another. It is then possible to optimize the programming of the memory cells.

One problem of implementing the calibration method according to the invention is that it requires a preliminary measurement of the characteristics to be adjusted, which can be done only during testing. The circuit must therefore be tested after being adjusted. Furthermore, the integrated circuits are parallel-tested by an automatic system. In practice, it is therefore not possible to have the programming period of each integrated circuit measured individually. To be applicable to such testing systems, a method of adjustment according to the invention should include identical steps for all the non-individualized integrated circuits.

Accordingly, an object of the invention is to provide a method for adjusting parameters of an integrated circuit that meets the above noted conditions.

According to the invention, the method for adjusting includes the activation, by the tester, of the integrated circuit programming signal, and then the sending of calibration values sequentially by the tester. Each calibration value corresponds to the ratio of the typical value T0 to the duration elapsed from the activation of the programming signal up to the sending of this value. In one example where the calibration values have been transmitted according to the I2C serial protocol, each value corresponds to a data byte. If Kn is the nth calibration value sent, this calibration value will thus be equal to $Kn=T0/9n \cdot T_{CK}$, where $T_{CK}$ is the period of the clock signal CK of the serial link. The end of the programming signal activates the recording of the last calibration value sent (or being sent). This value can then be programmed in a non-volatile memory.

This stored calibration value is applied to the input of an adjustment device associated with a reference circuit on which the duration of the programming signal depends. Thus, an adjusted reference circuit is provided. A reference circuit of this kind will typically be a current reference circuit or a capacitor (or capacitor network). By this method, the adjusted duration of the programming signal is equal or close to the typical value T0.

It should be noted that the calibration value is applicable to an adjustment device of any reference on which the duration of the programming signal depends. In the typical case where this duration results from the charging of a capacitor by a reference current, it is possible to adjust either the capacitor or the current.

This calibration value may furthermore serve to adjust other reference circuits of the same type as the reference circuits linked to the programming signal. In other words, by calibrating the duration of the internal timing signal, it is possible to adjust any reference of the integrated circuit coming from a structure identical to that of a reference circuit on which the duration of the internal timing signal depends.

It is, for example, typical for an integrated circuit to include several reference current sources. Initially, the dispersion affects these current sources in the same way. Thus, the same calibration value is applicable to the different reference current sources. It is therefore possible to provide for an adjustment device associated with each current source to apply the calibration value, determined by the adjustment method according to the invention, to this adjustment device. In general, the adjustment method according to the invention can be applied to any type of reference circuit, current source, voltage source, capacitor network or resistor network to which an internal timing signal of the integrated circuit can be made to correspond.

The method therefore includes activating the internal timing signal, where the end of the internal timing signal enables the recording of the corresponding calibration data in the integrated circuit. With the method according to the invention, the tester does not have to know the duration of the internal timing signal. It is thus possible to test and simultaneously calibrate the integrated circuits of one and the same technology in parallel with a table of calibration values of the internal timing signal set up for the technology.

The invention therefore relates to a method for adjusting a duration of an internal timing signal with a value close to a typical value of this duration. The method may include activating the internal timing signal in the integrated circuit and sequentially sending the calibration values to the input of the integrated circuit, its calibration value being equal to the ratio of the typical value to the duration elapsed since the activation. The expiration of the internal timing signal determines, as the calibration data of the integrated circuit, the last calibration value received or being received, and the calibration data is applied to a device for adjusting the duration of the internal timing signal. Furthermore, with the internal timing signal depending on at least one reference given by a reference circuit, the adjustment device may be applied to the reference circuit.

The invention also relates to a method for adjusting a reference in an integrated circuit. There is provided, in the integrated circuit, a device for adjusting the reference based upon calibration data, and a circuit for the generation of an internal timing signal from this reference. By applying the method of adjustment of duration to the internal timing signal thus generated, the calibration data to be applied to the device for adjusting this reference is obtained.

The invention also relates to an integrated circuit including a circuit for generating an internal timing signal from at least one reference, and means or circuitry for adjusting the reference. The adjustment means may include temporary recording means or circuitry for recording the data sent to a data input of the integrated circuit. The temporary storage means may be activated by the activation of the internal timing signal. Furthermore, a non-volatile memory element may be included to store the data in the temporary storage means on the expiration of the internal timing signal. At least one adjustment device may also be included for the adjustment of a circuit for the generation of the reference, the data in the non-volatile memory element being applied to the input of the adjustment device.

The invention also relates to a system for the parallel testing of integrated circuits.

BRIEF DESCRIPTION OF THE DRAWINGS

Other characteristics and advantages of the invention are described in detail in the following description, made by way of a non-limiting examples and with reference to the appended drawings, in which.

DETAILED DESCRIPTION OF THE PREFERRED EMBODIMENTS

Figure 1:
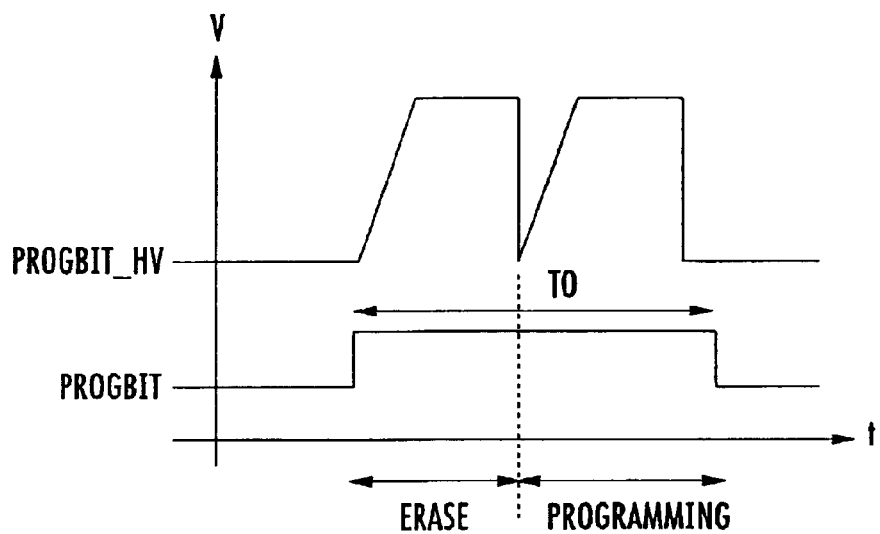
FIG. 1, already described, is a timing diagram illustrating the shape of a programming signal applied to the cells of an EEPROM according to the prior art.

Turning now to the drawings, a tester sends a calibration stimulus ST to an integrated circuit. This stimulus is detected by the integrated circuit, which goes into a calibration mode. In the example shown, the tester then sends an instruction INS1 from the set of operational instructions of the integrated circuit. This instruction activates the internal timing signal TEMP to be adjusted.

In an exemplary application of a method of adjustment to a memory circuit, to adjust the duration of the programming signal, this instruction will be a normal write instruction for the writing of any data whatsoever at any address whatsoever. Passage into the calibration mode may directly activate the internal timing signal, for example. However, by using the set of instructions of the integrated circuit, it is advantageously possible not to have to develop an excessive number of specific test program codes in the integrated circuit.

The activation of the timing signal authorizes (En) the reception of data. The tester knows the time of activation of the internal timing signal in the integrated circuit from the time when it has sent the instruction INS1. From this time forward, it successively sends the calibration values K1, K2, ..., to the input of the integrated circuit. Each of these values is equal to the ratio between, first, the typical value T0 of the duration of the internal timing signal and, second, the duration that has elapsed from the time of actuation to the time when it is sent.

Preferably, the tester sends the calibration values at a clock frequency. If each calibration value is encoded on a byte, and if $1/T_K$ is the frequency at which bytes are sent by the tester, the calibration values successively sent from the activation are $K1=T0/T_K$, $K2=T0/2 \cdot T_K$, ..., $Kn=T0/N \cdot T_K$. Should the integrated circuit follow a I2C serial data transmission protocol, the byte-sending period TK is equal to $9 \cdot Tck$, where Tck is the period of the clock signal CK of the serial link.

It should be noted that it is quite possible to have serial data transmission according to another protocol, such as the Microware or SPI protocol. It is also possible to have a parallel transmission of data. The invention is not restricted to one data transmission protocol.

The reception of data may be deactivated (Des) in the integrated circuit by the expiration of the internal timing signal (FINTEMP). The integrated circuit then no longer receives any data presented at the input. It may also terminate the reception of the data during the transmission (in the case of serial transmission). When the internal timing signal T$_{EMP}$ is ended (FINTEMP), the last calibration value sent or the calibration value being sent (according to the data reception management circuit) is the piece of calibration data K$_E$ for the integrated circuit considered. The reference K$_E$ is used herein for the piece of calibration data for the integrated circuit determined according to the method of the invention.

Figure 2A:
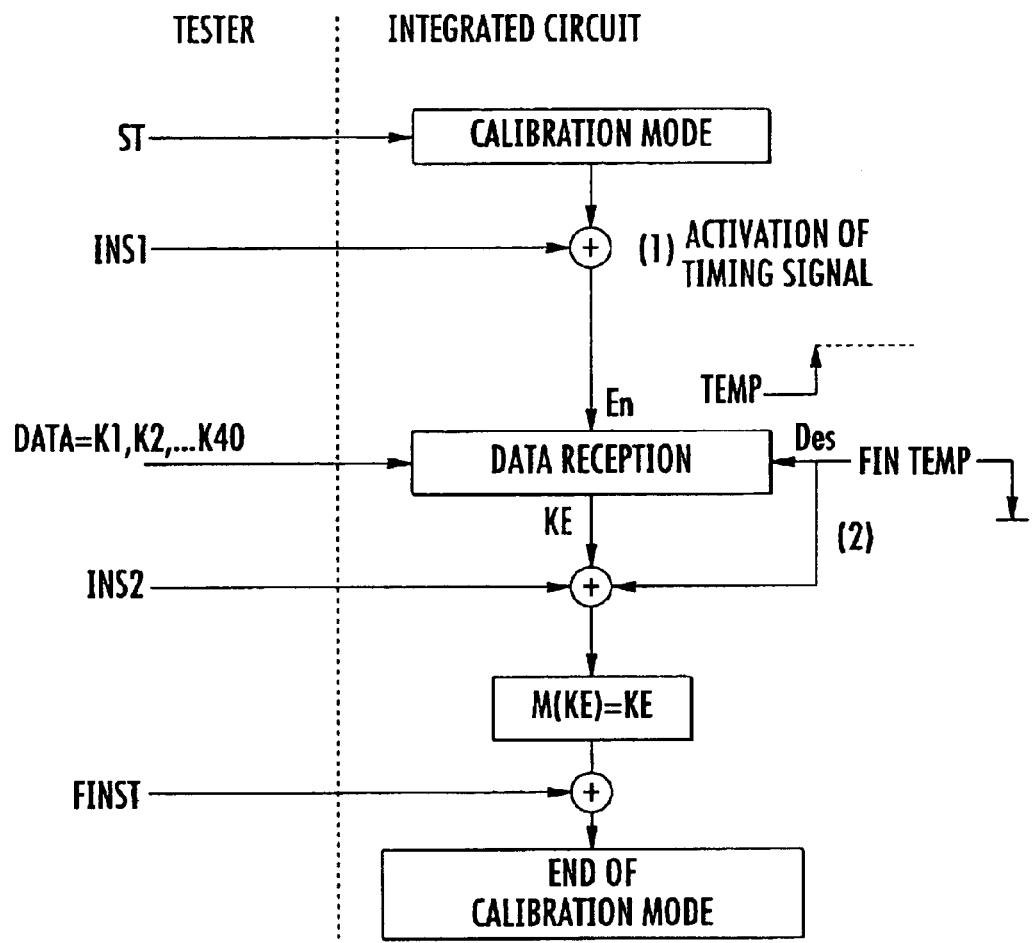
FIGS. 2a and 2b are, respectively, a flow diagram representing a method of adjustment according to the invention applied to an integrated circuit and a corresponding schematic block diagram of the tester and of the integrated circuit.

This piece of data is then stored in a non-volatile memory element which may be a fuse, an EPROM, or an EEPROM, for example. This storage may be controlled by the tester as shown in FIG. 2a. In this case, the tester sends an instruction INS2, preferably corresponding to an instruction of the set of operational instructions of the integrated circuit, to program this data. In one exemplary application of the method of adjustment to the programming duration in a memory circuit, the instruction INS2 will be a write instruction for writing the data K(E) at a particular address. The programming address M(K$_E$) for the calibration data K(E) is preferably determined internally in the integrated circuit. Thus, in an operational mode, it is not possible to modify the calibration data stored in the integrated circuit. The method of adjustment may then be terminated, and the integrated circuit may exit the calibration mode.

In the operational functioning mode of the integrated circuit, the non-volatile memory element M(K$_E$) is read and its contents K$_E$ are input into at least one device in the integrated circuit for the adjustment of a reference. The reading of the nonvolatile memory element may be done during initialization of the integrated circuit, which is activated by its being powered on. The calibration values sent by the tester are, in practice, included in a table (e.g., in a stack). This table is set up for a given manufacturing technology.

Figure 3A:
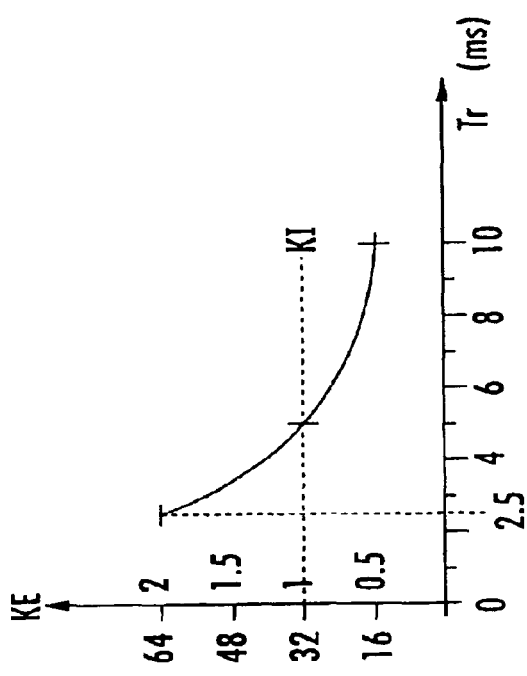
FIGS. 3a and 3b are graphs representing the development of the factor $K_E$ as a function of time according to the process of evaluation used in the invention.
Figure 3B:
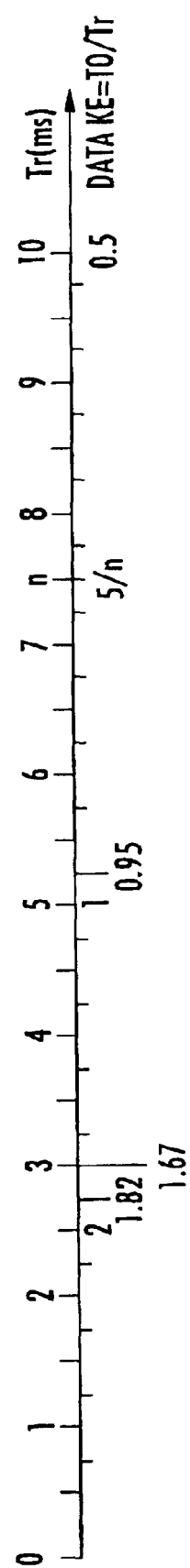

Referring to FIGS. 3a and 3b, the variation for a given manufacturing technology with a factor of proportionality K$_E$=Tr/T0 in the case of a programming signal is illustratively shown. In the example, the typical value T0 of the programming signal is equal to 5 milliseconds. The values of K$_E$ in the table of the tester correspond in practice to a sampling at the clock frequency of the tester. With a clock frequency of 4 MHz, the tester may send a new value every 0.25 milliseconds from the beginning of the programming for the maximum duration of the programming, typically 10 milliseconds. The table thus includes 40 values of K$_E$.

The tester may therefore start sending a value only after a minimum duration (e.g., 2.5 milliseconds) has passed (FIG. 3a). Below this duration, the integrated circuit is not adjusted and will be discarded. In the example illustrated in FIGS. 3a and 3b, the tester then sends the following values: the first value K1=2=(5/2.5) at t=2.5 ms; the second value K2=1.82=(5/2.75) at t=2.75 ms; ...; and the thirty-first value K31=0.5(5/10) at t=10 ms. The calibration table of the tester then includes thirty-one values.

Figure 2B:
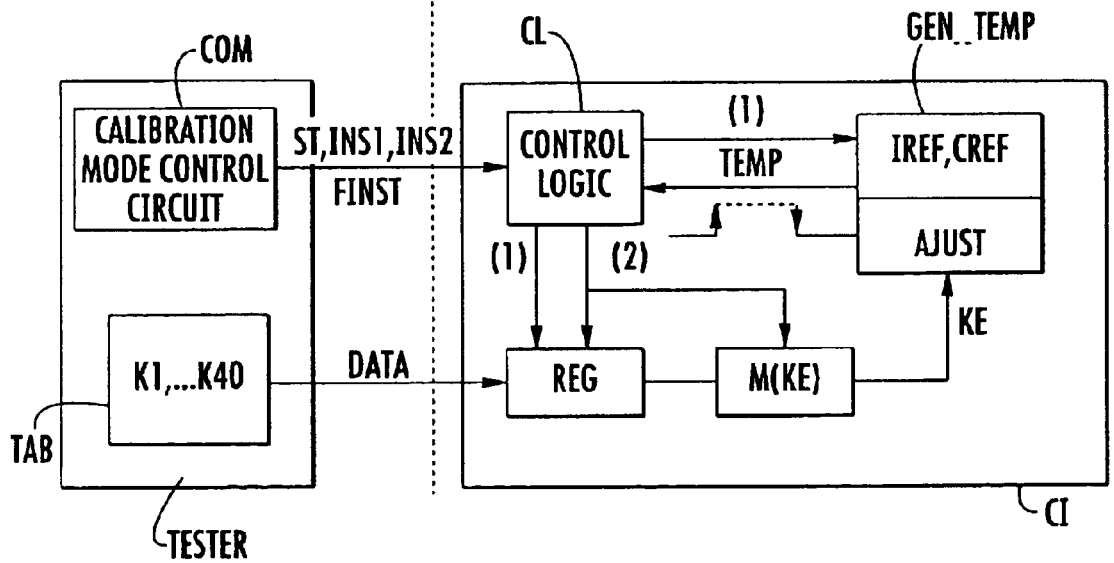

Each calibrated integrated circuit according to the invention may record the calibration value that corresponds to the real duration of its programming pulse value as the calibration data. A tester implementing the adjusting method according to the invention may then, as shown in FIG. 2b, include at least one clock signal CK, a table TAB of values K1, ..., K40 of the calibration data K$_E$, and a control circuit COM capable of launching the calibration mode, activating the internal timing signal, checking the sending of the calibration values and, if necessary, controlling the programming of the calibration data.

An integrated circuit to which the adjusting method according to the invention is to be applied prefereably includes at least one generation circuit GEN-TEMP for generating an internal timing signal TEMP with an adjusting device AJUST for adjusting the associated duration, and temporary recording means or circuitry RG, activated by the activation of the internal timing signal, to record the calibration values received at the input and deactivate it after the expiration of the timing signal (FINTEMP). Further, a non-volatile memory element MEM(K$_E$) may also be included to store the calibration data from the temporary recording means. The data in the non-volatile memory element may be input into the adjustment device AJUST.

In practice, an integrated circuit generally includes a data input register. This is particularly so with memory integrated circuits and serial transmission circuits. In such case it may be necessary to provide for modifying the control logic CL of the integrated circuit to make it recognize the calibration mode and control the different elements appropriately. It may also then be necessary to provide for a device for adjusting the reference. Such devices are within the scope of those skilled in the art and depend chiefly on the reference circuit in question and its structure.

The adjustment device acts on a reference on which the duration of the internal timing signal depends. This reference may be, for example, a reference current or the value of a capacitance. By extension, to adjust any reference whatsoever in the integrated circuit (e.g., a voltage source or a resistor), it is sufficient to convert such reference into a current, for example, and then use this current to generate a timing signal whose duration will be a function of this current. It is then possible to apply the adjusting method to the timing signal. The calibration data thus determined can also be applied to a device for adjusting the initial reference, such as a voltage or a resistance.

The invention will be explained more particularly with reference to the example of an EEPROM type non-volatile memory in a serial access integrated circuit for simplicity of explanation. However, the invention may be applied generally to any integrated circuit including a reference to which an internal timing signal can be made to correspond, and to both serial-access integrated circuits and parallel-access integrated circuits.

Figure 4:
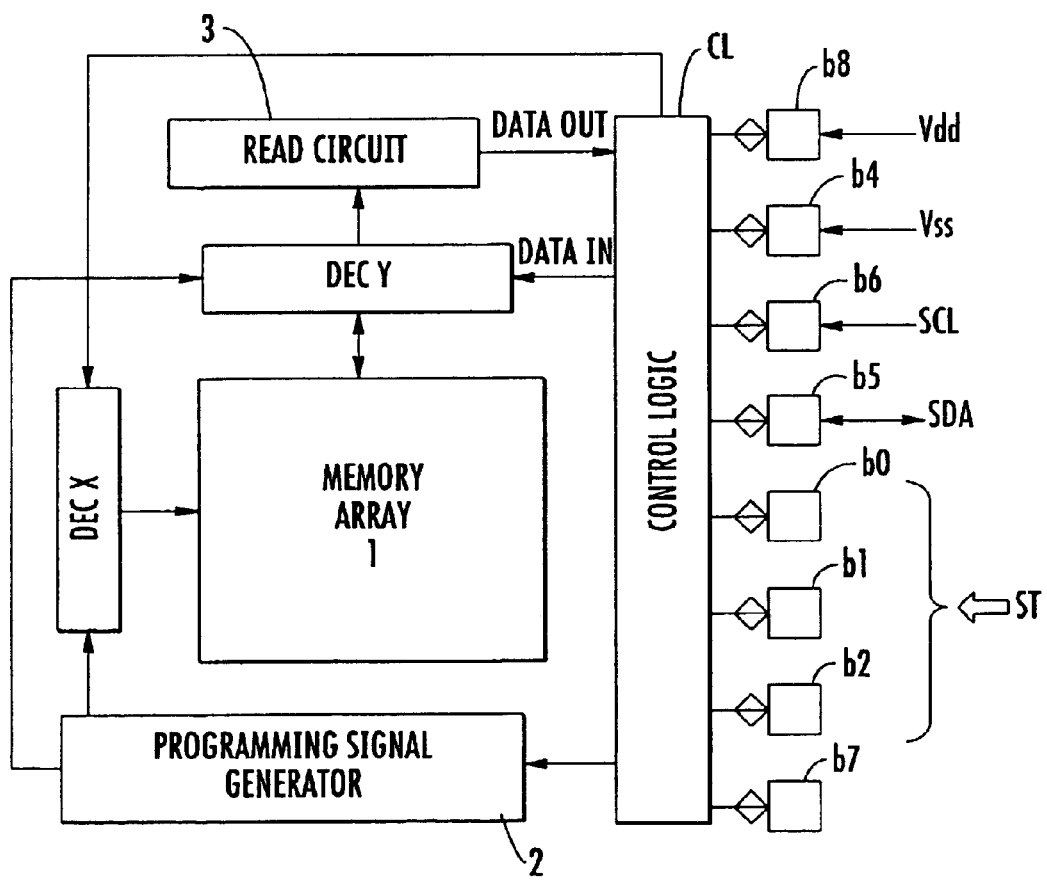
FIG. 4 is a schematic block diagram of an EEPROM according to the present invention.

A general block diagram of a serial-access EEPROM type 8-bit non-volatile memory integrated circuit is shown in FIG. 4. An integrated circuit of this kind usually includes eight external pins b1 to b8, not all of which are necessarily used operationally. In one example, for an I2C type serial interface, there is a pin b8 for the supply voltage Vdd, a pin b4 for ground, a pin b6 for the clock CK (SDL wire of the I2C bus), and a pin b5 for the input and output data (SDA wire of the I2C bus). The other pins b0, b1, b2 and b7 may be used for testing purposes in operational mode. In particular, the stimulus ST for activating the calibration mode according to the invention, which is represented as a code on three bits, may be applied to the pins b0, b1, b2.

The integrated circuit may also include a logic circuit CL to control the data exchanges at the input and output on the external bus and manage the internal control signals. It may furthermore include a memory array 1 of non-volatile memory cells, row address decoders DECX and column address decoders DECY enabling access to one or more cells of the memory, a circuit 2 for generating the programming pulse, and a read circuit 3. Circuits of this kind are well known to those skilled in the art.

To enable the application of a method for adjusting the duration of an internal timing signal of the integrated circuit according to the invention, adjusting means or circuitry may be provided as indicated in the block diagram of FIG. 2b. In the case of a memory integrated circuit for the calibration of the programming of the non-volatile memory, it is advantageously possible to use resources of the memory. In particular, the programming circuitry includes a programming data input register that receives the piece of data or the pieces of data to be programmed which are transmitted to the data input of the integrated circuit. This register is controlled by the logic circuit CL and may advantageously be used to record the calibration values sent by the tester.

The non-volatile memory element used to store the calibration data KE may be taken from the non-volatile memory array. It is preferably located in an additional addressing zone not accessible to the user. The logic circuit CL may be modified to appropriately control the reception of data in the calibration mode. Indeed, in normal write operation mode, when the logic circuit CL has received an instruction for programming a piece of data at a memory address, it is deselected. In one example, it is deselected by sending a stop signal (for the I2C protocol, a transition from logic 0 to logic 1 on the SDA line at the high level of a clock pulse). In another example, it is deselected by the chip select signal (parallel transmission or serial transmission according to an SPI protocol). It is the deselection that launches the programming. The integrated circuit no longer takes any data at the input.

In page mode, in which several bytes will be written at the same time the same row, at consecutive column addresses the integrated circuit first receives the programming instruction, the initial address, and the data, and then the deselection of the integrated circuit causes the programming to occur. To implement the method of adjustment according to the invention, the programming may first be activated and thereafter the integrated circuit is preferably capable of receiving the calibration values as input data.

According to the invention there is provided a calibration mode that uses the same data reception logic as in page mode, but does so after the activation of the programming. Thus, when the logic circuit CL decodes the ST stimulus, it goes into calibration mode. In this mode, after reception of a programming instruction (INS1) at any address ADSS of any piece of data DXX, the logic circuit activates the programming signal PROG. It then authorizes the successive recording, in the input register, of data for programming the transmitted calibration values.

The end of the programming signal stops this recording, either immediately to keep the last value received as a calibration value of the integrated circuit, or else after the end of the reception of the calibration value during transmission. The input register (or auxiliary register) then includes the data for calibrating the programming signal PROGBIT of the integrated circuit considered. A method of adjustment according to the invention applied to an integrated circuit of this kind therefore enables the adjustment of the duration of the programming signal of the cells of the non-volatile memory array.

After adjustment, the real duration Tr of the programming signal PROGBIT is close to the typical value T0 determined for the corresponding manufacturing technology (curve of the factor KE of FIGS. 3a and 3b). The precision of the adjustment depends on the frequency of the clock signal, namely the number of clock pulses sent during the programming period.

In this context, the method of adjustment according to the invention includes, for the tester, the steps of sending to the SDA data input a programming instruction with any address ADXX and any data DXX, and sending to the SDA data input of the integrated circuit the calibration values Ki. It is possible furthermore to provide for the tester to send a programming instruction to program the calibration data KE at an address reserved in the non-volatile memory. Preferably, internal logic is provided in the integrated circuit to launch this programming.

Figures 5A, 5B:
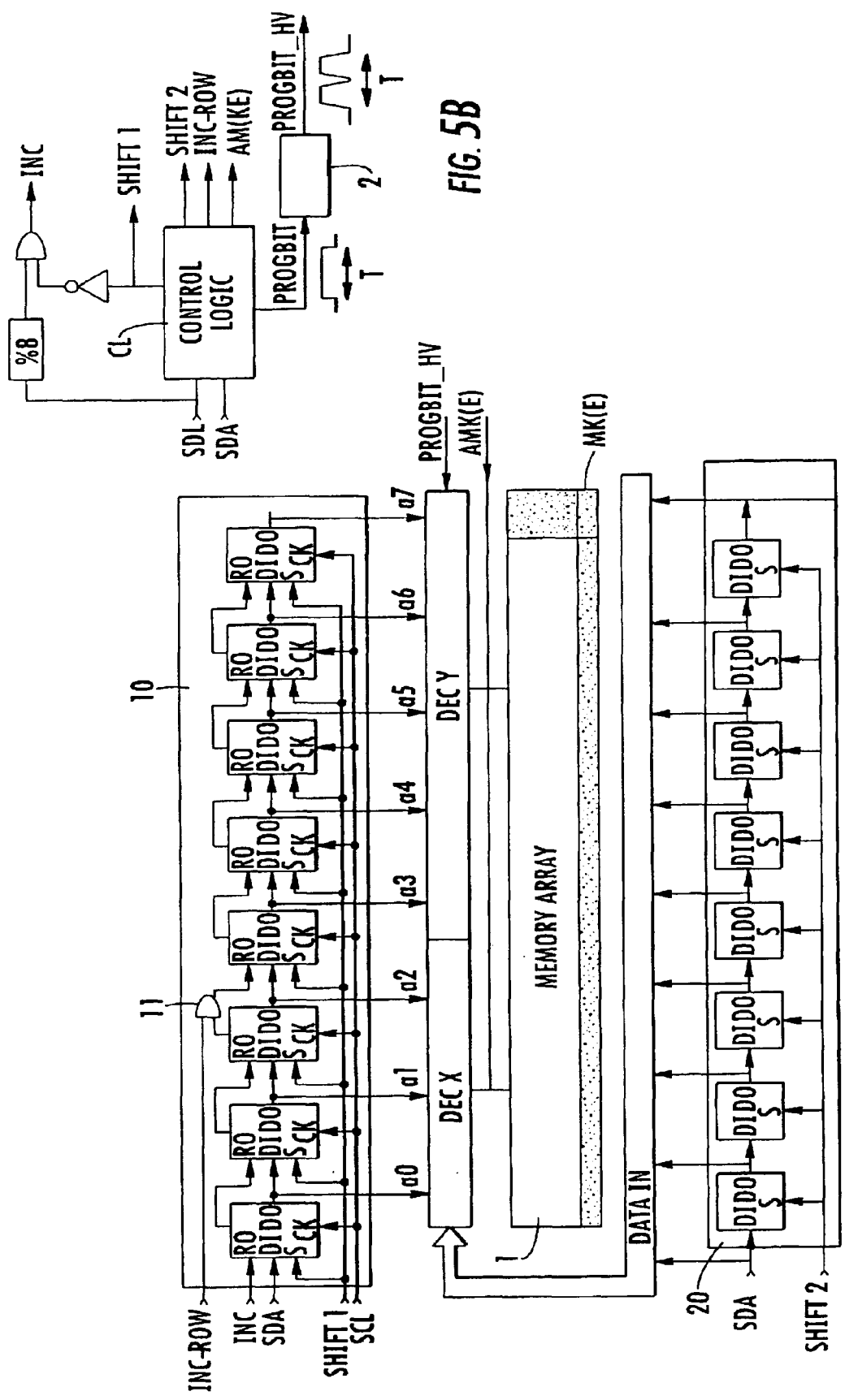
FIGS. 5A and 5B are schematic block diagrams respectively providing a more detailed view of the EEPROM programming circuitry and a circuit for determining and programming a piece of calibration data according to the method of the invention.

The working of the integrated circuit in the calibration mode will now be described further with reference to FIGS. 5 and 6. Circuitry for programming the non-volatile memory in an exemplary serial access integrated circuit is illustrated in FIG. 5. This programming circuitry includes, in a simplified terms, an address register 10 of the shift register type with counter operation (page mode management). As a data input, this address register receives the SDA signal of the serial interface, the SDL clock signal of the serial interface, and a shift-enabling signal Shift1 generated by the control logic circuit CL.

In the example, the outputs a7–a3 of the register 10 form the row address of the memory word to be programmed and are applied as inputs to the row decoder DECY. The outputs a2–a0 of this register are applied as inputs of the bit line decoder DECX. The enabling signal Shift1 is activated during the eight clock strokes following the reception of the instruction code PROG (FIG. 6) to store the eight address bits in the register 10. Further, the address register receives page mode control signals INC and INC-ROW with associated logic 11. These signals enable the automatic incrementing of the row address in page mode (counter mode operation).

The page mode is a well-known mode of programming in which the first address and then the data to be programmed from this address are presented. The circuit CL gives the column address incrementation signal INC to apply each new programming data to the latches of the associated column. The signal INC-Row is a row incrementation signal used in read mode.

The programming circuitry also includes a programming data input register 20 of the shift register type. This programming data input register receives, as a data input, the SDA serial interface signal and a write control signal Shift2 generated by the control logic circuit CL. The control logic circuit CL is sequenced by the clock signal CK.

In normal operational mode of the integrated circuit, the programming of a piece of data at an address of the memory takes place as follows. The circuit is selected for a serial type I2C protocol, i.e., the selection code is received by the SDA line and decoded by the logic circuit CL of the memory corresponding to a transition from logic 1 to logic 0 at the high level of a clock pulse. Since this code does not correspond to a data bit on the SDA line, it is not shown in FIG. 6. A programming request PROG is then received.

The control logic circuit CL then activates the control signal of the address register Shift1 to enable recording of the eight address bits transmitted in series on the SDA line. After eight clock pulses, the eight address bits ADXX are stored and applied as inputs to the decoders DECX and DECY. The control logic circuit CL then activates the control signal Shift2 of the data register for a duration corresponding to the reception of the data (namely eight clock strokes) to store the data to be programmed.

When the signal Shift2 falls backs, the control logic circuit CL is deselected. In other words, it no longer takes receives the data that it could otherwise receive from the serial interface SDA. The deselection launches the programming of the data in the register 20 at the selected memory address by activating the signal PROGBIT. This signal is applied to a circuit 2 for the generation of the programming signal (high voltage) PROGBIT, applied to the decoder.

In the calibration mode according to the invention, when the integrated circuit receives a programming command, the working of the control logic circuit is modified to enable the recording of the calibration values sent by the tester, in the data register 20, up to the end of the programming signal. The last value recorded is the piece of calibration data KE to then be programmed and a reserved address predefined in the integrated circuit of the non-volatile memory. The modification lies particularly in the generation of the signal Shift2. In the calibration mode, this signal Shift2 is not deactivated before the programming is launched, but only after the end of the programming signal PROGBIT. So long as it is active, the data register 20 continues to receive the bits applied to the SDA input. Thus, when the logic circuit decodes the stimulus ST applied in the example to the pins b0, b1, b2, it goes into the calibration mode to appropriately generate the signal Shift2.

Figure 6:
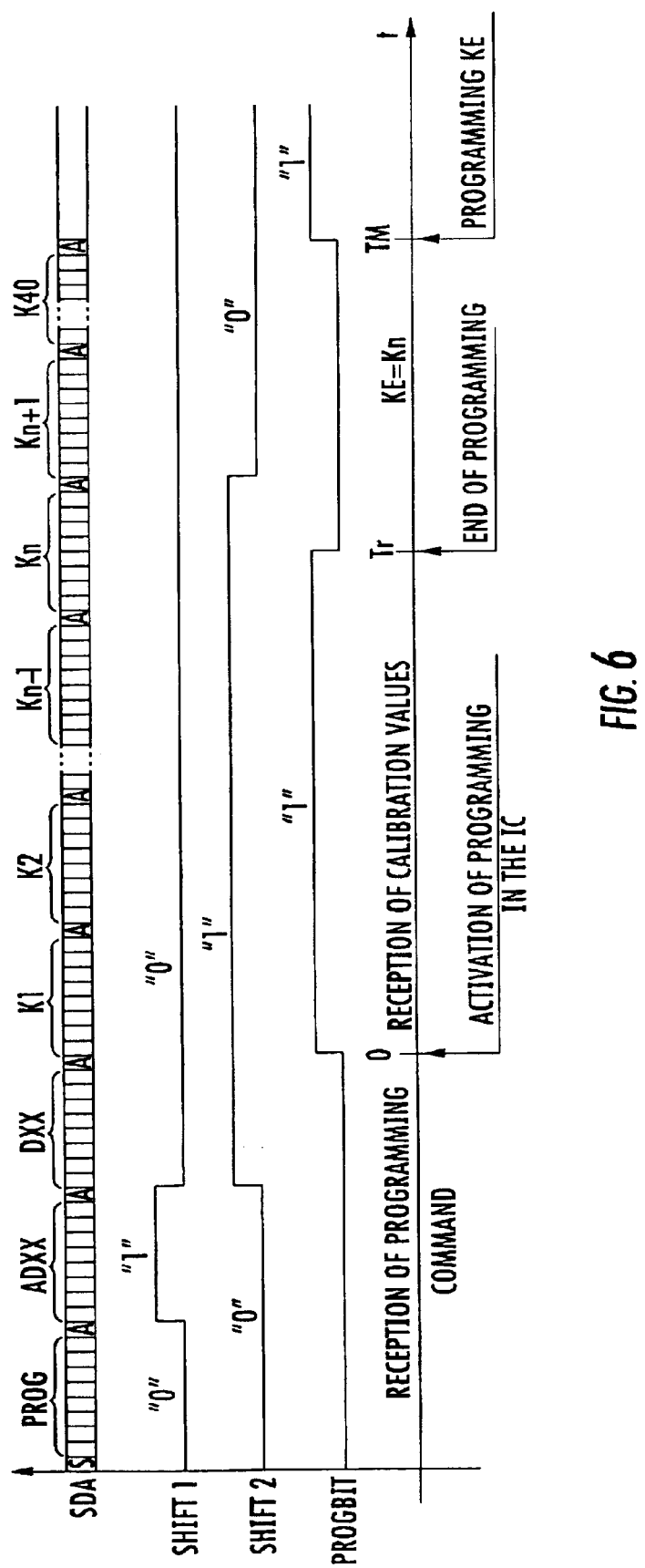
FIG. 6 is a timing diagram of the programming signals during the phase for determining and programming the calibration data.

The method of adjustment, as shown in FIG. 6, then includes selecting the integrated circuit, launching an operation of programming of any piece of data DXX with any address ADXX, and sequentially sending the calibration values (coming from the table of the tester) K1, K2, ..., Kn, Kn+1. The start of sending this data theoretically coincides with the start of the programming (PROGBIT at 1). Also, the signal Shift2 remains activated until the programming signal PROGBIT goes back to zero.

In a first variant shown in FIG. 6, the deactivation of the signal Shift2 (to 0) is controlled by the end of the programming (PROGBIT at 0) and the reception of the eight data bits. In other words, Shift2 goes back to zero at the first clock pulse that is a multiple of eight after PROGBIT has fallen back to 0. In this example, with reference to FIG. 6, it is the value Kn in the data register 20.

In another variant, the calibration data is the last value received. In this case, there is provided an auxiliary register (not shown) into which the contents of the data register 20 are transferred every eight clock pulses. When the programming signal PROGBIT is deactivated, the signal Shift2 is deactivated. The calibration data KE is then the value in the auxiliary register Kn−1 in the example of FIG. 6. All of these variants are relatively easy to implement and require little additional logic in the control logic circuit CL.

On the tester side, if there is no return of information planned (parallel testing), in practice it may systematically send all the values in its table (namely for example 40 values). When the tester has finished sending all the values, it is certain that each integrated circuit has the appropriate calibration data, either in the data register 20 or in an auxiliary register. It may therefore launch an operation for programming the calibration data KE at a reserved address. This programming follows the normal mode of programming, except for the fact that the address is imposed internally. For example, this may be done by an address setting bit AM(KE) that enables the direct selection of the column and the row corresponding to the memory element M(KE), where the value K(E) is programmed (FIG. 5).

In one variant shown in the timing diagram of FIG. 6, it is the integrated circuit itself that launches the programming of the calibration data. Indeed, the circuit is capable of knowing when the value of KE is determined and written in the data register by the logic signals which will block this value in the data register (or an auxiliary register) (e.g., by deactivation of the signal Shift2). The logic circuit can thus launch the programming of this value.

The adjustment method according to the invention applied to a memory integrated circuit therefore may require relatively minor modifications that are within the scope of those skilled in the art. Further, it is compatible with parallel testing of circuits.

The adjustment method according to the invention is not limited to applications to integrated circuits with serial data transmission according to a I2C protocol. It can be more generally applied to any integrated circuit and to any type of data transmission protocol. In particular, in the case of a parallel transmission protocol, each new calibration value is presented by the tester with a new address. The address transition detection circuit of the integrated circuit detects any change in address and prompts the storing of the associated calibration value in an input register.

The calibration data KE determined according to the method of the invention and stored in a nonvolatile memory element MEM(KE) should be applied to at least one associated adjustment device to activate a corresponding number of adjustment arms. In practice, the calibration data KE is encoded in the form of a byte.

In FIG. 3a, an exemplary binary encoding of the values of KE is thus given. In this example, for KE=2 the corresponding value is placed at 64 in the table of the calibration values; for Kr=1.5 the corresponding value is 48; for KE=1 the corresponding value is 32; and for KE=0.5 the corresponding value is 16. The calibration value KE determined by the adjustment method is stored in a non-volatile memory element M(KE). When the integrated circuit is powered on, an operation for reading this memory element may be used to initialize an input register R(KE) of the adjustment device.

Figure 7:
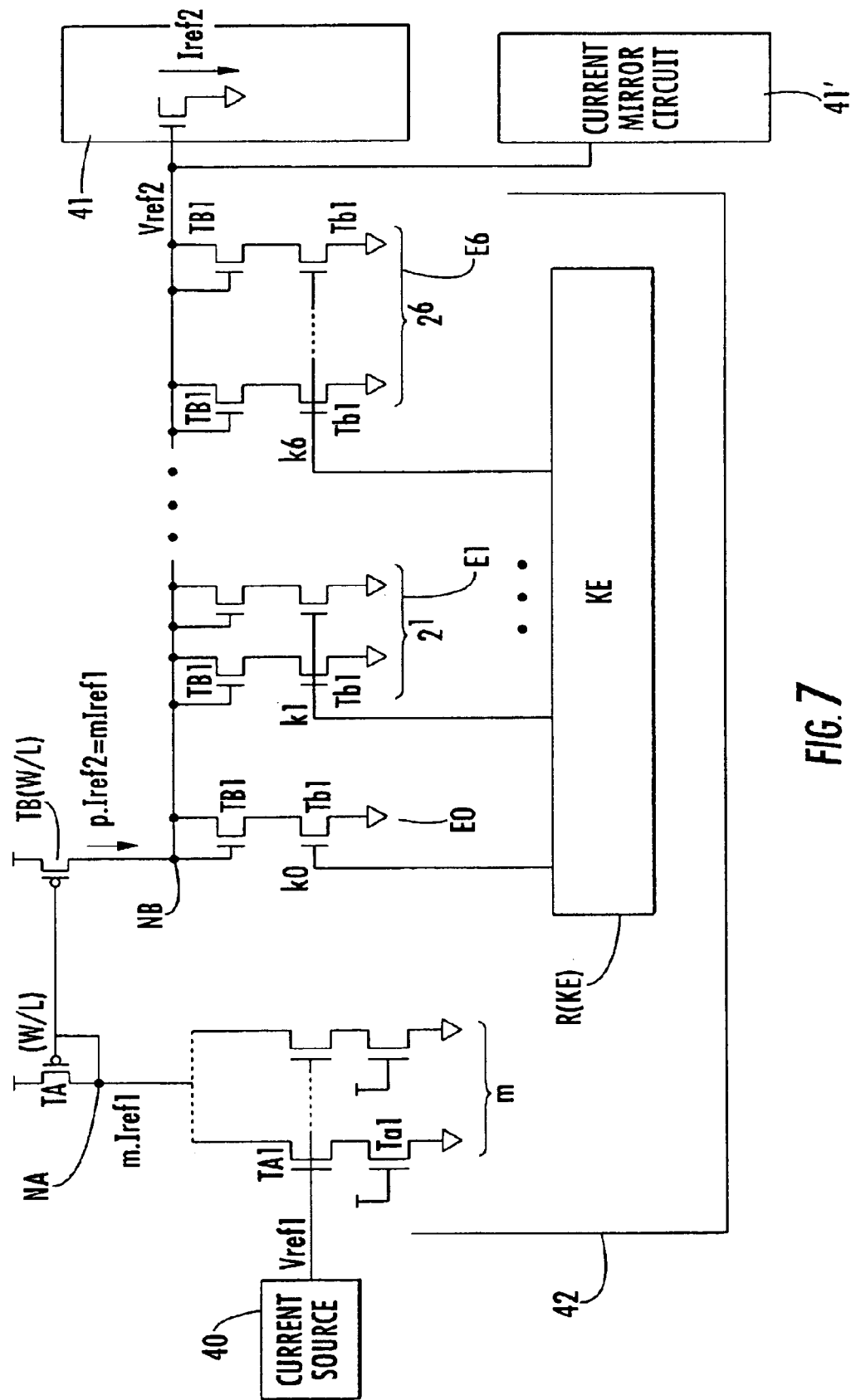
FIG. 7 is a schematic block diagram illustrating a first exemplary embodiment of the device of the present invention for the adjustment of a duration.
Figure 8:
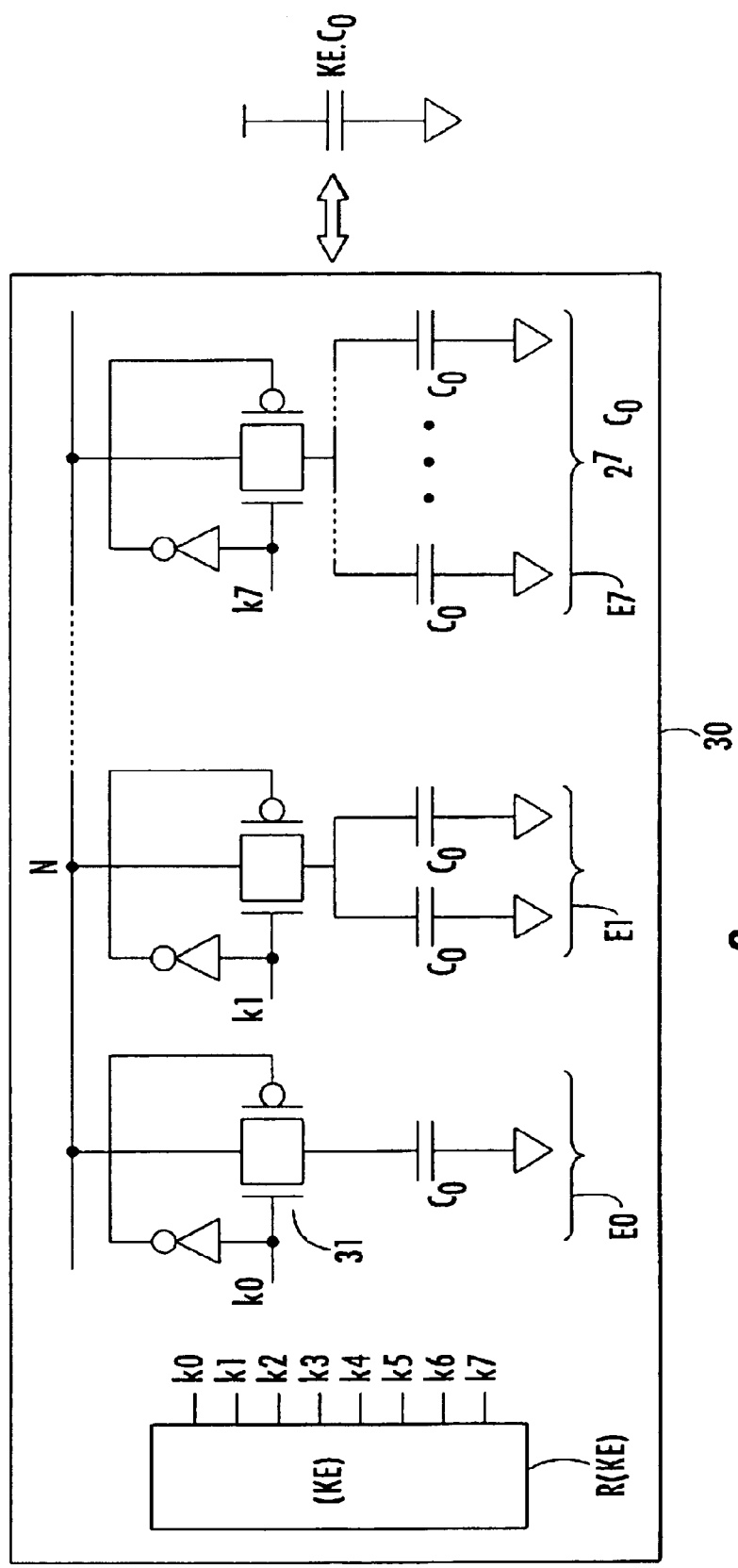
FIG. 8 is a schematic block diagram illustrating a second exemplary device of the present invention for the adjustment of a duration.

Two exemplary embodiments of a device for adjusting a reference are illustrated in FIGS. 7 and 8 show. The first exemplary embodiment shown in FIG. 7 is used to adjust a reference current intensity, e.g., the charging and discharging current of a capacitor (not shown). In the example, the current source 40 to be adjusted gives a voltage Vref1 at the output. This voltage may need to be applied in a current mirror circuit 41 to control a reference current Iref1 in this circuit.

According to the invention, a current Iref1 adjustment device 42 is placed between the output of the voltage source and the input of the circuit 41. This adjustment device includes a register R(KE) which is initialized with the calibration data KE. If, in one practical example, for the maximum value of KE(2 in the example of FIG. 3a), the register R(KE) is initialized at 64, and seven encoding bits are necessary, namely k0 to k6. In this case, seven adjustment stages are provided, making it possible to put 1 to 127 adjustment arms into service depending on the value of KE.

The adjustment device shown in FIG. 7 is based on a current mirror structure to give a reference voltage Vref2 at the output. In this way, the current controlled in the circuit 41 will be an adjusted current Iref2 instead of Iref1 with Iref2 equal to KE·Iref1. In the example, the current mirror structure of the adjustment device 42 of the current includes two arms with MOS transistors.

A first arm includes a transistor TA mounted as a diode and connected between the supply voltage Vdd and a node NA, and m parallel stages. Each parallel stage is connected between the node NA and ground and is controlled by the reference voltage Vref1. Each of these stages has a first transistor TA1 connected to the node NA and series-connected with a second transistor Ta1, which is connected to ground. The transistor TA1 is controlled at its gate by the voltage Vref1 and the transistor Ta1 is always on (gate at Vcc in the example). Each stage (TA1, Ta1) therefore draws a current Iref1, so that a current m·Iref1 is retrieved in the transistor TA.

The second arm has a transistor TB connected as a diode between the supply voltage Vdd and a node NB and six adjustment stages E0 to E6, one per encoding bit of the calibration data KE. The 0-ranking stage E0 has an adjustment arm controlled by the bit k0 of the piece of calibration data KE. The $6^{th}$ ranking stage E6 has 64 adjustment arms in parallel and controlled by the bit k6 of the piece of calibration data KE.

Each adjustment arm includes a transistor TB1 connected to the node NB and series-connected with another transistor Tb1 connected to ground. The transistor TB1 is connected as a diode. The transistor Tb1 is controlled by the corresponding bit of the piece of calibration data KE. Thus, the i-ranking stage Ei includes $2^i$ adjustment arms (TB1, Tb1), all controlled by the i-ranking data bit ki of the piece of calibration data KE.

Thus, depending on the number of adjustment arms put into service by the piece of calibration data KE, a reference voltage Vref2 is provided at the node B by which a current Iref2 equal to Iref1/KE is controlled in the circuit 41. If p is the number of arms put into operation by the piece of data KE, we indeed have a current p·Iref2 in the transistor TB which, by current mirror effect TA/TB, is equal to m·Iref1, giving Iref2=m/pIref1.

The m stages controlled by Vref1 are used to cover all the cases of KE. If KE is greater than 1, it may indeed be necessary to lower the current, but if KE is lower than 1 it may be necessary on the contrary to increase the current. In the former case m>p, and in the latter case p>m. The adjustment device illustrated in FIG. 8 adjusts the capacitance of a capacitor C substantially according to the same principle, i.e., the data bits KE enable the parallel connection of greater or smaller numbers of capacitors.

In the exemplary calibration of the programming signal, the capacitor to be adjusted is charged and discharged by a reference current to give a signal of calibrated duration at the output. The adjustment device 30 has n stages, one per bit ki of the calibration data KE. These stages of the adjustment device are parallel-connected between a node N and ground. If Cinit is the real capacitance of the capacitor to be adjusted, the adjustment device is used to obtain an equivalent capacitance at KE·Cinit.

The 0-ranking stage E0 includes an adjustment capacitor Ca and a pass-gate type circuit 31 controlled by the bit k0 of the calibration data KE. The I-ranking stage Ei has $2^i$ adjustment capacitors Ca in parallel, and a pass-gate type transfer gate 31 controlled by the bit ki of the piece of calibration data KE. The piece of calibration data KE thus controls the effective parallel connection of KE capacitors C0. A capacitance equivalent to KE·C0 is provided.

In practice, it will be noted that the adjustment devices are included in the integrated circuit. The register R(KE) should therefore be pre-initialized to connect at least one adjustment arm. There are known ways of positioning a register at a desired value, for example, by appropriate logic. This initializing value is referenced KI. Then, the calibration value KE measured according to the invention to be applied to the adjustment device should be in fact KE·KI. In practice, all the integrated circuits have their register R(KE) pre-initialized at the same value KI. It is therefore enough to apply the factor KI to the values of the calibration table in the tester.

Furthermore, if the register R(KE) is pre-initialized at the mean value 32 corresponding to KE=1, as shown in FIG. 3a, the dynamic range of encoding is in practice unchanged. If the initializing is done at another value, this amounts to shifting the values of KE upwards (KI>1) or downwards (KI<1). Other embodiments of adjustment devices are possible as a function of the structure of the reference circuit to be adjusted.

If the adjusted reference is applied in different circuits of the integrated circuit (as shown in FIG. 7, for example), and if the current reference circuit 40 is applied to two different circuits 41 and 41', the adjustment can be applied to two circuits 41 and 41'. Furthermore, since the divergence of the characteristics related to the manufacturing method acts in the same way, at the first level on all the elements of the integrated circuit, it is possible to apply the balancing data to several adjustment devices of the same type of reference. For example, several current reference sources may be adjusted. The adjustment device is the same for each. Only one calibration is needed, based on an internal timing signal connected to one of the references in question, and the calibration data can be applied to all these sources.

The invention that has just been described may be applied to the calibration of different types of references in an integrated circuit, provided that they are connected to an internal timing signal which can be activated externally such as the programming signal. It can be used to improve the characteristics of the integrated circuits, with a calibration close to that of the typical value, thus improving their reliability in operational terms and reducing the number of integrated circuits to be discarded. Furthermore, it enables the blind calibration of the integrated circuits in parallel. That is, since it is each circuit that determines its own calibration value, the tester limits its operation to activating the internal timing signal desired and sending the sequence of calibration values.

That which is claimed is:

1. A method for adjusting a duration of an internal timing signal in an integrated circuit, the method comprising:

activating the internal timing signal in the integrated circuit;

sequentially sending calibration values to an input of the integrated circuit, the calibration values being based upon a typical value of the duration of the internal timing signal;

determining a last calibration value received or being received by the integrated circuit based upon an expiration of the internal timing signal; and adjusting the duration of the internal timing signal based upon the determination of the last calibration value.

2. The method according to claim 1 wherein each calibration value corresponds to a ratio of the typical value to a total duration that has elapsed from activation of the internal timing signal to a time when the calibration value is sent.

3. The method according to claim 2 wherein the adjusting is performed by an adjustment device including an initialization value.

4. The method according to claim 3 further comprising assigning a factor to each calibration value corresponding to the initialization value.

5. The method according to claim 1 wherein sequentially sending the calibration values comprises sequentially sending the calibration values after a predetermined period has elapsed.

6. The method according to claim 1 wherein the internal timing signal is a function of at least one reference provided by a reference circuit, and wherein adjusting the duration of the internal timing signal comprises adjusting the duration of the internal timing signal via the reference circuit.

7. A method for adjusting a reference in at least one integrated circuit comprising:

generating an internal timing signal in the at least one integrated circuit based upon the reference;

adjusting a duration of the internal timing signal to obtain calibration data; and adjusting the reference in the at least one integrated circuit based upon the calibration data.

8. The method of claim 7 wherein adjusting the reference comprises adjusting the reference using a reference circuit in the at least one integrated circuit.

9. The method of claim 8 wherein the reference circuit comprises a current source.

10. The method of claim 8 wherein the reference circuit comprises at least one capacitor.

11. The method of claim 8 wherein the calibration data is also applied to a reference circuit of at least one additional integrated circuit, the reference circuit of the at least one additional integrated circuit being substantially identical to the reference circuit of the at least one integrated circuit.

12. The method of claim 7 wherein the at least one integrated circuit comprises a non-volatile memory integrated circuit, and wherein the reference comprises a signal for programming the non-volatile memory integrated circuit.

13. The method of claim 12 wherein adjusting the duration of the internal timing signal comprises:

programming data at an address in the non-volatile memory integrated circuit; and successively sending calibration values to an input of the integrated circuit to determine an end of the programming based upon a last calibration value received or being received.

14. The method of claim 13 further comprising sending all of the calibration values to the non-volatile memory integrated circuit prior to programming, and wherein the calibration values are defined as a function of specifications of the non-volatile memory integrated circuit.

15. The method of claim 13 wherein the address is determined internally to the integrated circuit.

16. The method of claim 13 wherein programming data at the address comprises programming data based upon an external programming command.

17. The method of claim 13 wherein the non-volatile memory integrated circuit further comprises a data input register, and wherein the calibration values are stored in the data input register.

18. A method for adjusting respective references in a plurality of integrated circuits comprising:

generating an internal timing signal in a first one of the integrated circuits based upon the reference thereof;

adjusting a duration of the internal timing signal to obtain calibration data; and adjusting the reference in each of the integrated circuits using respective reference circuits thereof based upon the calibration data.

19. The method of claim 18 wherein the reference circuit comprises a current source.

20. The method of claim 18 wherein the reference circuit comprises at least one capacitor.

21. The method of claim 18 wherein the reference circuits of the integrated circuits are substantially identical to one another.

22. The method of claim 18 wherein the reference comprises a signal for programming the memory.

23. The method of claim 22 wherein the integrated circuits comprises non-volatile memory integrated circuits, and wherein adjusting the duration of the internal timing signal comprises:

programming data at an address in the first non-volatile memory integrated circuit; and successively sending calibration values to an input of the first non-volatile memory integrated circuit to determine an end of the programming based upon a last calibration value received or being received.

24. The method of claim 23 further comprising sending all of the calibration values to the first non-volatile memory integrated circuit prior to programming, and wherein the calibration values are defined as a function of specifications of the non-volatile memory integrated circuit.

25. The method of claim 23 wherein the address is determined internally to the integrated circuit.

26. The method of claim 23 wherein programming data at the address comprises programming data based upon an external programming command.

27. The method of claim 23 wherein the first non-volatile memory integrated circuit further comprises a data input register, and wherein the calibration values are stored in the data input register.

28. An integrated circuit comprising:

a circuit for generating an internal timing signal from at least one reference;

temporary storage means for recording data sent to a data input of the integrated circuit after an activation of the internal timing signal;

a non-volatile memory element for storing data present in said temporary storage means upon an expiration of the internal timing signal; and a reference circuit and at least one adjustment device associated therewith for cooperating to adjust the at least one reference based upon the data stored in said non-volatile memory element.

29. The integrated circuit according to claim 28 wherein said reference circuit comprises a plurality of reference circuits, and a first one of said reference circuits being associated with said internal timing signal generating circuit; and wherein said at least one adjustment device comprises a first adjustment device for adjusting the first reference circuit and at least one second adjustment device for adjusting another of said reference circuits, said other reference circuit being substantially identical to said first reference circuit, and the data stored in said non-volatile memory element being applied to said first and second adjustment devices.

30. The integrated circuit according to claim 28 wherein the integrated circuit comprises a non-volatile memory device, wherein the internal timing signal comprises a programming signal for the non-volatile memory, and wherein said temporary storage means comprises a data input register.

31. The integrated circuit according to claim 28 wherein said reference circuit comprises a current reference circuit.

32. The integrated circuit according to claim 28 wherein said reference circuit comprises at least one of a capacitor and a capacitor network.

33. The integrated circuit according to claim 28 wherein said reference circuit comprises at least one resistor.

34. An integrated circuit comprising:

an array of non-volatile memory cells;

a circuit for generating an internal timing signal from at least one reference, the internal timing signal being a programming signal for the non-volatile memory cells;

a temporary storage device for recording data sent to at least one data input of the integrated circuit after an activation of the internal timing signal;

said array of non-volatile memory cells comprising at least one cell for storing data present in said temporary storage device upon an expiration of the internal timing signal; and a reference circuit and at least one adjustment device associated therewith for cooperating to adjust the at least one reference based upon the data stored in said at least one cell.

35. The integrated circuit according to claim 34 wherein said reference circuit comprises a plurality of reference circuits and a first one of said reference circuits being associated with said internal timing signal generating circuit; and wherein said at least one adjustment device comprises a first adjustment device for adjusting the first reference circuit and at least one second adjustment device for adjusting another of said reference circuits, said other reference circuit being substantially identical to said first reference circuit, and the data stored in said at least one cell being applied to said first and second adjustment devices.

36. The integrated circuit according to claim 34 wherein said reference circuit comprises at least one of a current reference circuit, a capacitor, and a resistor network.

* * * * *